United States Patent [19]

Tsuchiya et al.

[11] Patent Number: 4,492,879
[45] Date of Patent: Jan. 8, 1985

[54] TRIGGER CIRCUIT

[75] Inventors: Yutaka Tsuchiya, Hamamatsu; Eiji Inuzuka, Shizuoka; Yuji Shinoda, Hamamatsu, all of Japan

[73] Assignee: Hamamatsu Terebi Kabushiki Kaisha, Shizuoka, Japan

[21] Appl. No.: 312,126

[22] Filed: Oct. 16, 1981

Related U.S. Application Data

[63] Continuation-in-part of Ser. No. 709, Jan. 3, 1979, abandoned.

[51] Int. Cl.³ .......................... H03K 5/04; H03K 5/02; H03K 17/60
[52] U.S. Cl. .................................... 307/248; 307/267; 307/268; 307/263; 307/302
[58] Field of Search .................. 307/247 R, 267, 268, 307/263, 302, 248

[56] References Cited

U.S. PATENT DOCUMENTS

| | | | |
|---|---|---|---|
| 3,303,356 | 2/1967 | Bell | 307/302 |
| 3,308,308 | 3/1967 | Bray | 307/302 |
| 3,319,138 | 5/1967 | Bergman et al. | 307/302 |
| 3,331,968 | 7/1967 | Hickey | 307/302 |
| 3,553,499 | 1/1971 | Maguire | 307/302 |

OTHER PUBLICATIONS

Image Intensifiers: Technology, Performance, Requirements and Applications—Proceedings of the Society of Photo-Optical Instrumentation Engineers, vol. 42, Aug. 27–29, 1973, "Picosecond Image Converter Streak Cameras for Laser Diagnostics", pp. 171-179.

Primary Examiner—John Zazworsky
Attorney, Agent, or Firm—Robert E. Burns; Emmanuel J. Lobato; Bruce L. Adams

[57] ABSTRACT

A trigger circuit comprises a shaping circuit connected between an input terminal receiving a trigger signal and an avalanche transistor. The shaping circuit has a pass band whose upper limit frequency is much lower than the frequency component of the leading edge of the input trigger signal, and it has a saturation characteristic to provide a pulse whose time width is sufficient to start the avalanche transistor.

3 Claims, 4 Drawing Figures

TRIGGER CIRCUIT

RELATED APPLICATION

This application is a continuation-in-part of prior copending application Ser. No. 000,709 filed Jan. 3, 1979, and now abandoned.

BACKGROUND OF THE INVENTION

This invention relates to streak tubes, and more particularly to a trigger circuit for a streak tube.

A streak camera requires an ultra high speed ramp voltage generating circuit in which, upon application of a trigger signal, the voltage is changed about 2000 volts in several nanoseconds. In this case, pulse light applied to the photoemitting surface of the streak tube is partly reflected to be applied to a pin photodiode to thereby generate a trigger signal, and this trigger signal is used to start a switching circuit of avalanche transistors to thereby provide the above-described high speed ramp voltage. The ramp voltage is applied to the deflecting plates of the streak tube to deflect the flow of electrons emitted from the photoemitting surface, whereby the relation between time and incident optical intensity is observed as the relation between position and luminescent intensity on the phosphor screen.

If the duration of the above-mentioned light pulse is in the range of picoseconds, as in a mode locked Nd: glass laser, the intensity of the light pulse will vary within about ±50%. When an avalanche transistor is driven by an output signal of a pin photodiode which receives such a light pulse, the delay time which elapses from the application of the trigger signal to the avalanche transistor until the switching circuit of the avalanche transistor is started is not constant, resulting in approximately a one nanosecond difference therebetween. Therefore, it is impossible to define the relation between time and position on the phosphor screen, which prevents accurate measurements.

SUMMARY OF THE INVENTION

Accordingly, an object of this invention is to eliminate all of the above-described difficulties accompanying a conventional trigger device or trigger circuit for a streak tube.

More specifically, an object of this invention is to provide a trigger circuit for a streak tube, by which an image can be provided at a constant position on the phosphor screen of the streak tube irrespective of the intensity and the waveform of incident light.

The novel features which are considered characteristic of this invention are set forth in the appended claims. This invention itself, however, as well as other objects and advantages thereof will be best understood by reference to the following detailed description of an illustrative embodiment, when read in conjunction with the accompanying drawings.

DETAILED DESCRIPTION OF THE INVENTION

Figure 1:
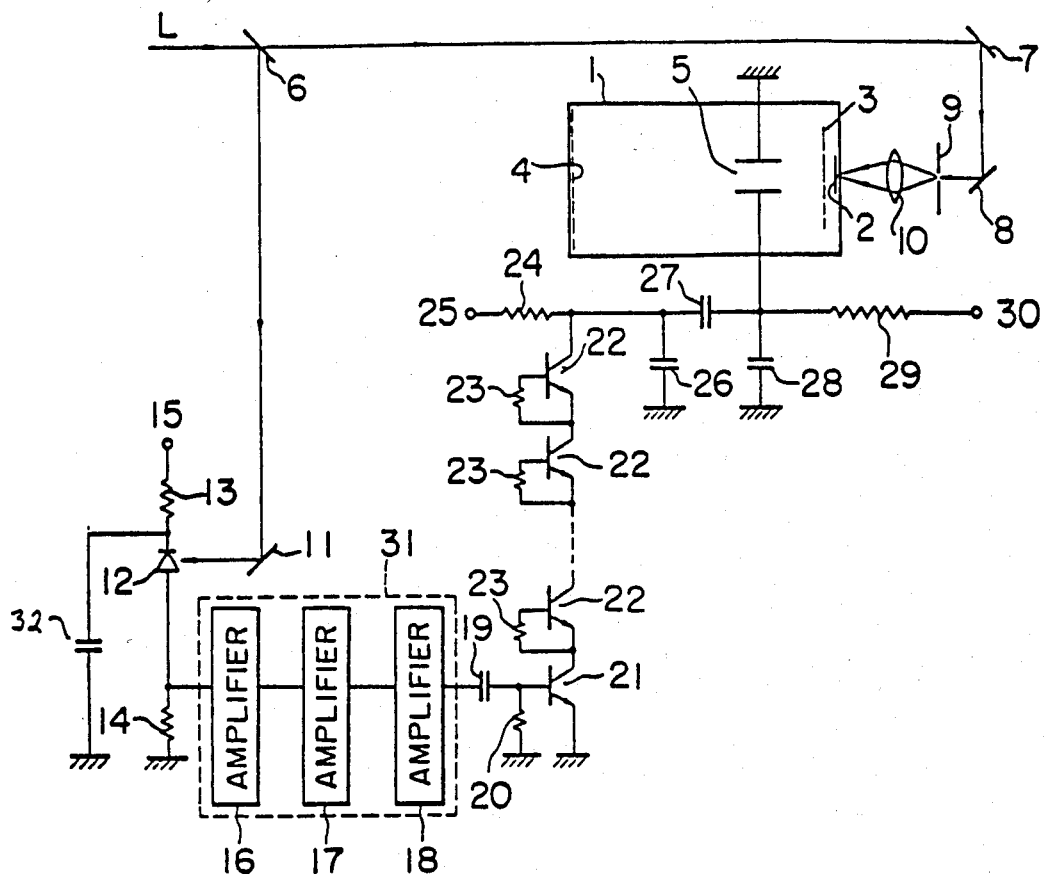
FIG. 1 is a circuit diagram, partly a block diagram, showing one example of a trigger circuit according to the invention.

FIG. 1 is a circuit diagram, partly a block diagram, showing one example of a trigger circuit according to this invention. A streak tube 1 is a high vacuum container in the form of a cylinder. A light entrance window is provided at one end of the high vacuum container, and a photoelectric surface 2 is provided inside the light entrance window. A mesh-shaped electron (photoelectron) accelerating electrode 3 is disposed in front of the photoelectric surface 2. A phosphor screen 4 is provided at the other end of the streak tube 1, and a pair of deflection plates 5 are arranged between the phosphor screen 4 and the electron (photoelectron) accelerating electrode 3.

In the observation of a light intensity variation occurring in a range of picoseconds, for instance the light of a laser pulse L, light is applied through a half mirror 6 and reflecting mirrors 7 and 8 to a slit 9 perpendicular to the plane of the drawings. As a result, the image of the slit 9 is formed on the photoelectric surface 2 of the streak tube 1 by means of a lens 10. On the other hand, the light reflected by the half mirror 6 is further reflected by a reflecting mirror 11, finally entering a pin photodiode 12. The anode of the photodiode 12 is connected to a resistor 14. The connection of the photodiode 12 and the resistor 13 is grounded through a capacitor 32.

A voltage on the order of 40 volts is applied through the resistor 13, or the terminal 15 of the resistor 13, to the photodiode 12, and its output voltage developed across the resistor 14 is applied to a resistor 20 through amplifier circuits 16, 17 and 18 each comprising one or several transistors, and through a coupling capacitor 19. A voltage developed across the resistor 20 is applied between the base and emitter of an avalanche transistor 21. The collector of the avalanche transistor 21 is connected to one terminal of a series circuit of a plurality of similar avalanche transistors 22, 22, . . . and 22. Each avalanche transistor 22 has a resistor 23 connected between its base and emitter. The other terminal of the series circuit of the avalanche transistors 22 is connected to a resistor 24. A voltage of, for example, 2000 volts is applied to the terminal 25 of the resistor 24. The other terminal of the series circuit of the avalanche transistors 22, or the connection of the series circuit and the resistor 24 is connected to a capacitor 26; that is, a series circuit of the transistors 21 and 22 is shunted by the capacitor 26. The capacitor 26 is shunted by a series circuit of capacitors 27 and 28. The provision of the capacitor 28 is not always necessary. The connection of the capacitors 27 and 28 is connected to one of the deflection plates 5, and receives a voltage of, for example, 1000 volts through a resistor 29 from a terminal 30. The other deflection plate 5 is grounded.

When a single light pulse, for example laser light, is applied to the half mirror 6, the pin photodiode 12 is rendered conductive. As a result, a trigger signal is applied to the amplifier circuit 16, and then this trigger signal is applied to the base of the avalanche transistor 21 through the amplifier circuits 17 and 18, thereby to render the transistor 21 conductive. Accordingly, the other avalanche transistors 22 are simultaneously rendered conductive, and as a result the capacitor 26 is instantaneously discharged from 2000 volts to about zero volts. This voltage variation is imparted through the capacitor 27 to the deflecting plates 5. At the same time, the aforementioned light pulse is applied to the photoemitting surface 2, as a result of which electrons (photoelectrons) are emitted thereby. Therefore, the emitted photoelectrons are swept by the voltage variation of the deflection plate and an image representative of the time variation of the incident light intensity appears on the sweep tube phosphor screen as a change in luminescent intensity with position. The image can be photographed for analysis.

In the above-described device, the upper limit frequency of the pass band of the amplifier 16 is much lower than the frequency component of the rise part or leading edge of the input trigger signal. The amplifier circuit 17 is constructed to saturate at a sufficiently low input voltage, thus developing a constant output voltage. The amplifier circuit 18 is provided with a holding circuit made up of, for instance, a capacitor, so that even if the time width of the input pulse is relatively short, a pulse having more than a predetermined time width is developed as an output signal. Furthermore, the amplifier circuits 17 and 18 are so designed that the upper limit frequencies of their pass bands are sufficiently high. Thus, the amplifier circuits 16, 17 and 18 form a shaping circuit 31. However, it should be noted that the shaping circuit 31 may be comprised of only one or two amplifier circuits.

Figure 2:
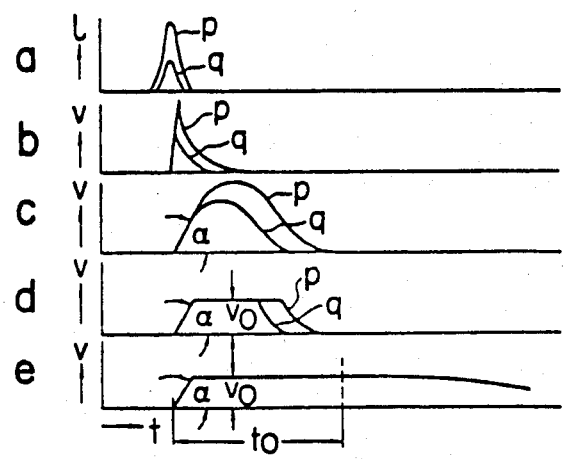
FIG. 2 is a graphical representation of signal waveforms for describing the operation of the trigger circuit shown in FIG. 1.

In the device thus constructed, if it is assumed that the relation between intensity l and time t of the pulse light L is as indicated by p and q in part a of FIG. 2 (in which p indicates a higher amplitude pulse and q indicates a lower amplitude pulse), then a trigger signal having a rise time shorter than one nanosecond is applied to the shaping circuit 31 as indicated by p and q in part b of FIG. 2 in which p corresponds to p in part a and q corresponds to q in part a. The upper limit frequency of the pass band of the amplifier circuit 16 is much lower than the frequency component of the rise part of each of the above-described trigger signals p and q. Therefore, the amplifier 16 output signals corresponding to input signals p and q are independent of the rise waveforms of the signals p and q, and rise with a substantially constant ramp angle $\alpha$, for instance $4 \times 10^9$ V/sec, which is determined from the amplifier 16 upper limit frequency. The waveforms of the amplifier 16 output signals corresponding to input signals p and q are shown in part c of FIG. 2. These respective signals are applied to the saturable amplifier circuit 17 whose saturation voltage $V_0$ is sufficiently low. Therefore, the amplifier circuit 17 develops an output signal having a constant amplitude $V_0$, for example of 15 volts, as indicated by reference characters p and q in part d of FIG. 2, and the amplifier 17 output signal is applied to the amplifier circuit 18. In the amplifier circuit 18, the signal duration is lengthened from the predetermined time width $t_0$ as described before. Therefore, the amplifier circuit 18 outputs a trigger signal having a time width of, for instance, more than seven nanoseconds, and the trigger signal is applied to the avalanche transistor 21.

Figure 3:
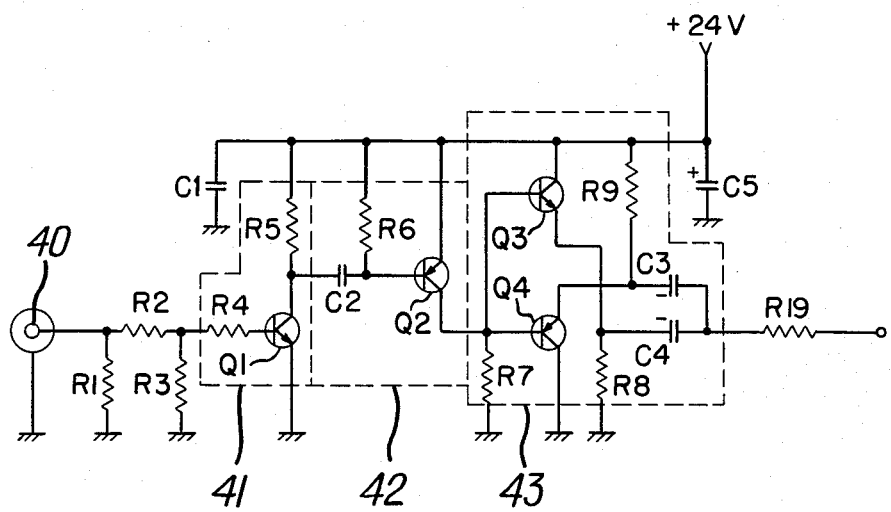
FIG. 3 illustrates a circuit diagram of a signal shaping circuit of the present invention.
Figure 4:
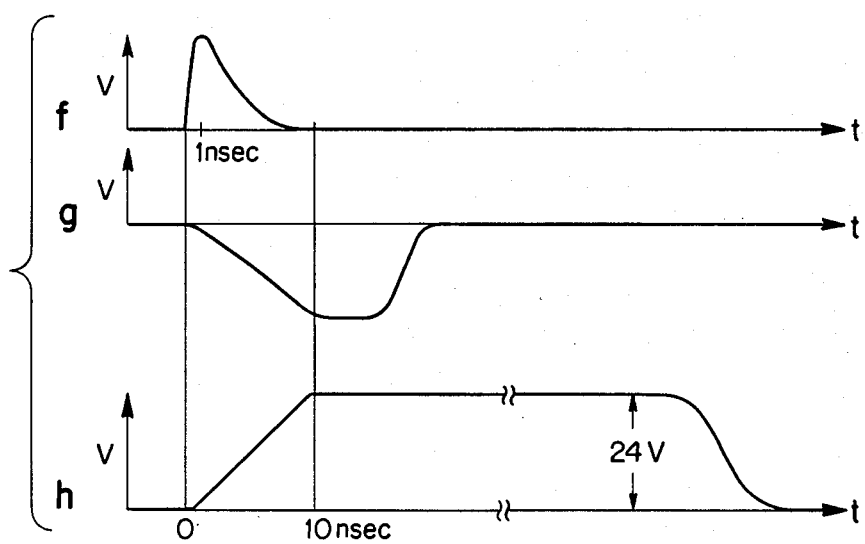
FIG. 4 illustrates waveforms of signals developed during the operation of the signal shaping circuit.

FIG. 3 illustrates another embodiment of the signal shaping circuit 31. Input signal terminal 40 receives a pulse (f in FIG. 4) having a rise time of one nano second generated by the pin photodiode 12 in response to the application of a light pulse L. In response, the amplifier 41 develops a pulse as indicated by g in FIG. 4. Because the rise speed of the pulse f applied to the amplifier 41 is much faster than the response speed of the amplifier 41, the rise speed of the output pulse g of the amplifier 41 is a constant determined by the response speed of the amplifier 41. The rise time is continued for about 10 nanoseconds. The output of the amplifier 41 is applied to the base of the transistor of an amplifier 42 and is high enough to saturate the base current. Therefore the output h (FIG. 4) of the amplifier 42 rises at a constant rate of about $2.4 \times 10^9$ v/sec which is determined only by the response speed of the amplifiers 41 and 42 and becomes 24 volts when saturated. The input pulse f falls before the output pulse h of the amplifier 42 reaches the bias voltage of 24 volts. Because the base current of the transistor has been supplied at saturation level, minority carriers remain in the base and therefore the saturation output voltage is maintained for longer than 100 nano seconds. The output signal of the amplifier 42 is applied to the amplifier 43. The amplifier 43 is simply an impedance converter that operates as a drive amplifier which reduces the output impedance to drive the avalanche transistors. In amplifier 43, resistance R8 and R9 are load resistors and capacitors C3 and C4 are coupling capacitors.

Representative values of the components shown in FIG. 3 are set forth in the following table:

| Resistor | value ($\Omega$) | Capacitor | value ($\mu$F) |
|---|---|---|---|
| R1 | 220 | C1 | .01 |
| R2 | 20 | C2 | .002 |
| R3 | 220 | C3 | 10 |
| R4 | 30 | C4 | 10 |
| R5 | 1K | C5 | 4.7 (35V.) |
| R6 | 1K | | |
| R7 | 810 | | |
| R8 | 2K | | |
| R9 | 2K | | |
| R10 | 150 | | |

| Transistor | Identification |
|---|---|
| Q1 | 2 SC 379 |
| Q2 | 2 SA 495 |
| Q3 | 2 SC 372 |
| Q4 | 2 SA 495 |
| (Japanese Industrial Standard) | |

In the switching operation of an avalanche transistor, an avalanche phenomenon is caused by carriers injected into the junction region between the collector and the base of the transistor. More specifically, the avalanche phenomenon is caused when the number of injected carriers exceeds a predetermined value. Therefore, when a trigger signal whose rise part is constant in ramp angle $\alpha$ and amplitude $V_0$ is applied to the avalanche transistor, the switching circuit of the avalanche transistors is started with a predetermined delay time $t_0$. The signal shaping circuit 31 delivers a trigger signal whose time width is much longer than the time $t_0$.

Thus, in the trigger device according to the invention, even if the input trigger signal is changed, as represented by waveforms p and q in the part a of FIG. 2, a trigger signal which has a constant amplitude and leading edge and which is sufficiently long is applied to the avalanche transistor switching circuit, and therefore the switching circuit is started with the constant delay time $t_0$ at all times. Accordingly, if the optical path length is so set that the light pulse is applied to the photoelectric surface 2 in the streak tube 1 with the delay time $t_0$ after the application of the input trigger signal to the shaping circuit 31, the image can be provided at a constant position on the fluorescent screen 4 at all times. Therefore, in the observation of weak pulse light, the brightness can be increased by forming at the same position the luminescent images corresponding to a plurality of light pulses.

As was described before, heretofore the ultra high speed sweep operation of a streak tube by an avalanche transistor switching circuit is delayed by several nanoseconds, and the delay time fluctuates approximately one nanosecond, and therefore it is impossible to control the position of the image on the streak tube. Also, it has been found that this difficulty is due to the amount of carriers injected into the junction of the avalanche transistor. According to the present invention, a signal shaping circuit as provided at the input of the avalanche transistor so that a signal which is constant in rise speed and in amplitude and has a sufficiently long time duration, irrespective of the waveform and amplitude of the detected light signal, is applied to the avalanche transistor. Therefore, the aforementioned fluctuation of the delay time is reduced to less than 100 picoseconds which is approximately one-tenth of that in the prior art. Accordingly, the image can be provided at the constant position on the phosphor screen of the streak tube independent of the intensity and waveform of the incident light.

What is claimed is:

1. In combination, an avalanche transistor and a trigger circuit responsive to trigger signals of variable intensity for driving said avalanche transistor into a conductive mode, said trigger signals having a frequency component, said trigger circuit comprising:
    a first circuit stage receiving said trigger signals and comprising band pass amplifier means having an upper limit frequency much lower than the frequency component of the trigger signals to produce output signals which rise with a substantially constant ramp angle independent of waveforms of the trigger signals and,
    a second circuit stage receiving output signals from said first circuit stage and comprising saturable amplifier means having a saturation voltage which is sufficiently low that said saturable amplifier means develops output signals having a substantially constant amplitude.

2. A combination according to claim 1, in which said trigger circuit further comprises amplifier circuit means receiving output signals from said saturable amplifier means and producing output signals of greater time width which are applied to said avalanche transistor.

3. A combination according to claim 1, in which said trigger circuit further comprises drive amplifier means which receives output signals from said saturable amplifier means and reduces output impedance to drive said avalanche transistor.

* * * * *